US 11,851,343 B2

(12) United States Patent
Cheng et al.

(10) Patent No.: US 11,851,343 B2
(45) Date of Patent: Dec. 26, 2023

(54) PREPARATION METHOD FOR METAL OXIDE NANOPARTICLE FILM AND ELECTRICAL COMPONENT (71) Applicant: TCL TECHNOLOGY GROUP CORPORATION, Huizhou (CN)

(72) Inventors: Luling Cheng, Huizhou (CN); Yixing Yang, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 813 days.

(21) Appl. No.: 16/622,645

(22) PCT Filed: Mar. 20, 2018

(86) PCT No.: PCT/CN2018/079534
§ 371 (c)(1),
(2) Date: Dec. 13, 2019

(87) PCT Pub. No.: WO2019/001026
PCT Pub. Date: Jan. 3, 2019

(65) Prior Publication Data
US 2020/0308017 A1  Oct. 1, 2020

(30) Foreign Application Priority Data
Jun. 28, 2017 (CN) .......................... 201710508825.8

(51) Int. Cl.
C01G 23/053 (2006.01)
H01L 33/34 (2010.01)
(Continued)

(52) U.S. Cl.
CPC ............ C01G 23/053 (2013.01); H01L 33/34 (2013.01); B82Y 30/00 (2013.01); B82Y 40/00 (2013.01);
(Continued)

(58) Field of Classification Search
CPC .. C01G 23/053; C01G 23/00; C01G 23/0475; H01L 33/34; H01L 33/06; H01L 33/502;
(Continued)

(56) References Cited

U.S. PATENT DOCUMENTS

2010/0225013 A1* 9/2010 Eiha ...................... B82Y 30/00
977/902
2016/0035979 A1* 2/2016 Lee ...................... H10K 50/171
438/34

FOREIGN PATENT DOCUMENTS

CN 101264928 A 9/2008
CN 106062983 A 10/2016
(Continued)

OTHER PUBLICATIONS

The World Intellectual Property Organization (WIPO) International Search Report for PCT/CN2018/079534 dated Jun. 20, 2018 6 Pages.

Primary Examiner — Karen Kusumakar
Assistant Examiner — Adam S Bowen
(74) Attorney, Agent, or Firm — ANOVA LAW GROUP, PLLC (57) ABSTRACT A preparation method for a metal oxide nanoparticle film and an electrical component, comprising: preparing a halogen ligand-containing metal oxide nanoparticle by performing heated alcoholysis of a metal halide in an organic alcohol; and employing a solution method on the halogen ligand-containing metal oxide nanoparticle to prepare a halogen ligand-containing metal oxide nanoparticle film. The halogen ligand-containing metal oxide nanoparticle is produced by means of performing the alcoholysis of the metal halide, then the halogen ligand-containing metal oxide nanoparticle is prepared into the film, and then a halogen is utilized once again in a passivation processing of the film, this not only further reduces defects on the surface of the
(Continued)

metal oxide nanoparticle, but also further improves charge transfer between the metal oxide nanoparticle and an active functional layer and increases transfer efficiency, thus increasing component efficiency.

12 Claims, 2 Drawing Sheets

(51) Int. Cl.
  *B82Y 30/00* (2011.01)
  *B82Y 40/00* (2011.01)
(52) U.S. Cl.
  CPC ...... *C01P 2004/64* (2013.01); *C01P 2006/40* (2013.01)
(58) Field of Classification Search
  CPC ..... B82Y 30/00; B82Y 40/00; C01P 2004/64; C01P 2006/40; H10K 30/00; H10K 50/00; H10K 71/00; H10K 30/35; H10K 50/16; H10K 2102/00; Y02E 10/549
  See application file for complete search history.

(56) References Cited

FOREIGN PATENT DOCUMENTS

| CN | 106229393 A | 12/2016 |
| CN | 106566529 A | 4/2017 |
| WO | 2007028972 A1 | 3/2007 |

\* cited by examiner

PREPARATION METHOD FOR METAL OXIDE NANOPARTICLE FILM AND ELECTRICAL COMPONENT

CROSS-REFERENCES TO RELATED APPLICATIONS

This application is a national stage application of PCT Application No. PCT/CN2018/079534, filed on Mar. 20, 2018, which claims priority to Chinese Patent Application No. 201710508825.8, filed on Jun. 28, 2017, the content of all of which is incorporated herein by reference.

FIELD OF THE DISCLOSURE

The present disclosure relates to the field of electrical components and the technical field of semiconductor material preparation thereof, and more particularly, to a preparation method for a metal oxide nanoparticle film and an electrical component thereof.

BACKGROUND

In a research process of an electrical component, an important research topic is how to well transport a charge from an active functional layer to a pair of electrode layers, so as to improve a performance of the component. Taking a battery component as an example, a selection of a structure and a structural functional layer for a perovskite battery component has been greatly improved. A main purpose of taking a metal oxide nanoparticle, including $TiO_2$, ZnO, $SnO_2$, $Zn_2SnO_4$ and more, as an electron transport layer, is applied for a better transportation of a charge. Using the metal oxide nanoparticles to prepare a component, has a good advantage, that is, either a metal oxide nanoparticle nanocrystal or a metal oxide nanoparticle precursor may be prepared into a solution, and various electrical components may be prepared by a solution method, while at a same time, a fabrication cost of the component may be lowered. When preparing a component with the metal oxide nanoparticles, a respective role is different for a different active functional layer. In the perovskite battery component, a main function of the metal oxide nanoparticle is transporting a charge. In a preparation process for the battery component in the prior art, a $TiO_2$ metal oxide nanoparticle precursor is adopted to preparing a solution for a spin coating, before performing a high-temperature annealing, to improve a crystallization effect of an oxide nanocrystal, so as to improve a transport effect of the charge. Although such a high-temperature annealing method is able to further improve a conversion efficiency of a photovoltaic device, the high-temperature annealing may bring a plurality of problems, including: an annealed $TiO_2$ may produce a plurality of mesopores at an interface, a plurality of defects may exist between the mesopores and the active functional layer, thus in a certain extent, it may hinder transporting a charge, while a heat treatment process of the high temperature annealing is complicated, which is not conducive for a flexible large-scale preparation, while increasing a fabrication cost of the component. According to the problems, researchers have developed a metal oxide nanoparticle, to lower a temperature of a high-temperature annealed metal oxide nanoparticle precursor, so as to further improve a fabrication process of the component. If a preparation temperature of the metal oxide nanoparticle can be controlled at a relatively low temperature (<150° C.), using such a nanoparticle may not only improve the performance and the fabrication process of the component, but also reduce the fabrication cost of the component. By using such a metal oxide nanoparticle nanocrystal to prepare the electron transport layer, although it has greatly improved the fabrication process of the component, an improvement in collecting and transporting a charge is still not very significant. And a same problem exists in the field of a semiconductor light-emitting device.

Therefore, the current technology needs to be improved and developed.

BRIEF SUMMARY OF THE DISCLOSURE

According to the above described defects in the prior art, the purpose of the present disclosure is providing a preparation method for a metal oxide nanoparticle film and an electrical component thereof, in order to solve a problem in the prior art that, on a surface of the metal oxide nanoparticle film, there are a plurality of defects exist, and causing the metal oxide nanoparticle film to hinder transporting the charge when acting as the electron transporting layer of the battery component.

A technical solution of the present disclosure to solve the technical problems is as follows:

A preparation method for a metal oxide nanoparticle film, wherein comprising:
  preparing a metal oxide nanoparticle containing a halogen ligand by performing a heated alcoholysis for a metal halide in an organic alcohol;
  preparing and obtaining a metal oxide nanoparticle film containing the halogen ligand from the metal oxide nanoparticle containing the halogen ligand by adopting a solution method.

The preparation method for the metal oxide nanoparticle film, wherein a step of preparing the metal oxide nanoparticle containing the halogen ligand by performing the heated alcoholysis for the metal halide in the organic alcohol, comprising:
  mixing and heating the metal halide and the organic alcohol, then make a centrifugal separation process to a reaction system by a first organic solvent and a second organic solvent, before obtaining the metal oxide nanoparticle containing the halogen ligand.

The preparation method for the metal oxide nanoparticle film, wherein the metal halide and the organic alcohol are mixed according to a molar to volume ratio of the metal halide to the organic alcohol in a range of (1-3 mmol): (5-20 ml);
  the metal halide is one of $TiCl_4$, $TiBr_4$, $TiI_4$, $ZnCl_2$, $ZnBr_2$, and $ZnI_2$, in an embodiment, the organic alcohol is a phenyl alcohol, including at least one of: benzyl alcohol, phenylethyl alcohol, phenylbutanol, 2,4-benzenediethanol, 1,4-benzenediethanol, 3,4-benzenediethanol, 2,4-benzenedimethanol, 1,4-benzenedimethanol, 3,4-benzenedimethanol, 2,4-benzene dibutanol, 1,4-benzene dibutanol, and 3,4-benzene dibutanol; the first organic solvent and the second organic solvent have a different polarity, the first organic solvent is at least one of ethanol, methanol, and acetone, the second organic solvent is at least one of ethyl acetate, methyl acetate, and ethyl formate. The metal oxide nanoparticle is one of $TiO_2$, ZnO, $SnO_2$, and $Zn_2SnO_4$, while a size of the metal oxide nanoparticle is between 1 and 15 nm. A molar ratio of the halogen ligand to a metal element on an outer surface of the metal oxide nanoparticle is from 10% to 15%. The halogen ligand is a halogen atom or a halogen ion;

and the halogen atom is one of F, Cl, Br, and I, and the halogen ion is one of $F^-$, $Cl^-$, $Br^-$, and $I^-$.

The preparation method for the metal oxide nanoparticle film, wherein a temperature for the heated alcoholysis is 40-150° C., a time for the heated alcoholysis is 1 to 4 hours, a concentration of the metal halide is 0.1-0.5 mmol/ml.

The preparation method for the metal oxide nanoparticle film, wherein a step of preparing the metal oxide nanoparticle film containing the halogen ligand from the metal oxide nanoparticle containing the halogen ligand by adopting the solution method, comprising:

dispersing the metal oxide nanoparticle containing the halogen ligand in a mixed polar solvent and non-polar solvent, and obtaining a metal oxide nanoparticle solution containing the halogen ligand;

preparing the metal oxide nanoparticle film containing the halogen ligand from the metal oxide nanoparticle solution containing the halogen ligand by adopting the solution method.

In an embodiment, the preparation method for the metal oxide nanoparticle film, wherein the polar solvent is at least one of ethanol, methanol, and aceton, the non-polar solvent is at least one of chloroform, n-hexane, chlorobenzene, toluene, and octane.

In an embodiment, the preparation method for the metal oxide nanoparticle film, wherein after preparing the metal oxide nanoparticle film containing the halogen ligand from the metal oxide nanoparticle containing the halogen ligand by adopting the solution method, further comprising: making a passivation process to the metal oxide nanoparticle film containing the halogen ligand by using a halogen molecule, before obtaining a metal oxide nanoparticle film containing the halogen ligand with a surface passivated by the halogen.

Wherein, a step of making a passivation treatment comprises: soaking the metal oxide nanoparticle film containing the halogen ligand in a carbon tetrachloride solution containing a halogen molecule, and the metal oxide nanoparticle film containing the halogen ligand with the surface passivated by the halogen is then obtained after being dried. Further, the carbon tetrachloride solution containing the halogen molecule, wherein a concentration of the halogen molecule is 0.1-1 mmol/ml, a time for the soaking is 10-30 min. wherein the halogen molecule is one of a halogen element and an interhalogen compound; the halogen element is one of $F_2$, $Cl_2$, $Br_2$, and $I_2$, the interhalogen compound is one of ICl, IBr, and $ICl_3$.

An electrical component, the electrical component comprises an electron transporting layer, a material of the electron transporting layer is the metal oxide nanoparticle film containing the halogen ligand prepared according to the method disclosed in the present disclosure, or a material of the electron transporting layer is the metal oxide nanoparticle film containing the halogen ligand with the surface passivated by the halogen prepared according to the method disclosed in the present disclosure.

Specifically, the electrical component is a quantum dot light-emitting diode (a QLED component), the QLED component comprises a cathode, a hole transporting layer, a quantum dot light-emitting layer, an electron transporting layer and an anode. A material of the quantum dot light-emitting layer is a perovskite quantum dot light-emitting material. Further, the perovskite quantum dot light-emitting material is an inorganic perovskite quantum dot light-emitting material or an organic perovskite quantum dot light-emitting material, for example, the inorganic perovskite quantum dot light-emitting material comprises a $CsPbCl_3$ quantum dot light-emitting material, a $CsPbBr_3$ quantum dot light-emitting material, a $CsPbI_3$ quantum dot light-emitting material, the organic perovskite quantum dot light-emitting material comprises a quantum dot light-emitting material of $CH_3NH_3PbX$ (X=Cl, Br, I).

When the quantum dot light-emitting layer adopts an inorganic non-perovskite quantum dot light-emitting material, for example, the inorganic non-perovskite quantum dot light-emitting material may be: a binary phase quantum dot, including, but not limited to: CdS, CdSe, CdTe, InP, AgS, PbS, PbSe, HgS and more quantum dot light-emitting materials; a ternary phase quantum dot, including, but not limited to: $ZnxCd_{1-x}S$, $CuxIn_{1-x}S$, $ZnxCd_{1-x}Se$, $ZnxSe_{1-x}S$, $ZnxCd_{1-x}Te$, $PbSexS_{1-x}$ and more light-emitting materials; a quaternary phase quantum dot, including, but not limited to: $ZnxCd_{1-x}S/ZnSe$, $CuxIn_{1-x}S/ZnS$, $ZnxCd_{1-x}Se/ZnS$, CuInSeS, $ZnxCd_{1-x}Te/ZnS$, $PbSexS_{1-x}/ZnS$ and more light-emitting materials; a material of the electron transport layer is a metal oxide nanoparticle film containing the halogen ligand with the surface passivated by the halogen.

Specifically, the electrical component is a perovskite battery component, the perovskite battery component comprises a cathode, a hole transporting layer, a perovskite quantum dot light-absorbing layer, an electron transporting layer and an anode. Wherein the electron transporting layer is adjacent to the perovskite quantum dot light-absorbing layer. A material of the perovskite quantum dot light-absorbing layer is an inorganic perovskite quantum dot material or an organic perovskite quantum dot material, for example, the inorganic perovskite quantum dot material comprises $CsPbCl_3$, $CsPbBr_3$, and $CsPbI_3$, the organic perovskite quantum dot material comprises $CH_3NH_3PbX$ (X=Cl, Br, I).

Specifically, the electrical component is a QLED component, the QLED component comprises a cathode, a hole transporting layer, a quantum dot light-emitting layer, an electron transporting layer and an anode. Wherein the electron transporting layer is adjacent to the quantum dot light-emitting layer, an interface between the electron transporting layer and the quantum dot light-emitting layer has a halogen bond connection. A material of the electron transporting layer is the metal oxide nanoparticle film containing the halogen ligand prepared according to the method disclosed in the present disclosure, or the metal oxide nanoparticle film containing the halogen ligand with the surface passivated by the halogen prepared according to the method disclosed in the present disclosure.

A material of the quantum dot light-emitting layer is a perovskite quantum dot light-emitting material. Further, a material of the perovskite quantum dot light-emitting layer is an inorganic perovskite quantum dot light-emitting material or an organic perovskite quantum dot light-emitting material, for example, the inorganic perovskite quantum dot light-emitting material comprises a $CsPbCl_3$ quantum dot light-emitting material, a $CsPbBr_3$ quantum dot light-emitting material, a $CsPbI_3$ quantum dot light-emitting material, the organic perovskite quantum dot light-emitting material comprises a quantum dot light-emitting material of $CH_3NH_3PbX$ (X=Cl, Br, I).

When the quantum dot light-emitting layer is an inorganic non-perovskite quantum dot light-emitting material, (for example, the inorganic non-perovskite quantum dot light-emitting material may be: a binary phase quantum dot, including, but not limited to: CdS, CdSe, CdTe, InP, AgS, PbS, PbSe, HgS and more quantum dot light-emitting materials; a ternary phase quantum dot, including, but not limited to: $ZnxCd_{1-x}S$, $CuxIn_{1-x}S$, $ZnxCd_{1-x}Se$, $ZnxSe_{1-x}S$, $ZnxCd_{1-x}Te$, $PbSexS_{1-x}$ and more quantum dot light-emitting materials; a quaternary phase quantum dot, including but not limited to: $ZnxCd_{1-x}S/ZnSe$, $CuxIn_{1-x}S/ZnS$, $ZnxCd_{1-x}Se/ZnS$, $CuInSeS$, $ZnxCd_{1-x}Te/ZnS$, $PbSexS_{1-x}/ZnS$ and more quantum dot light-emitting materials), a material of the electron transport layer is a metal oxide nanoparticle film containing the halogen ligand with the surface passivated by the halogen.

Specifically, the electrical component is a perovskite battery component, the perovskite battery component comprises a cathode, a hole transporting layer, a quantum dot light-absorbing layer, an electron transporting layer and an anode. Wherein the electron transporting layer is adjacent to the quantum dot light-absorbing layer, an interface between the electron transporting layer and the quantum dot light-absorbing layer has a halogen bond connection. A material of the electron transporting layer is the metal oxide nanoparticle film containing the halogen ligand prepared according to the method disclosed in the present disclosure, or the metal oxide nanoparticle film containing the halogen ligand with the surface passivated by the halogen prepared according to the method disclosed in the present disclosure. Further, a material of the quantum dot light-absorbing layer is an inorganic perovskite quantum dot material or an organic perovskite quantum dot material, for example, the inorganic perovskite quantum dot material comprises $CsPbCl_3$, $CsPbBr_3$, and $CsPbI_3$, the organic perovskite quantum dot material comprises $CH_3NH_3PbX$ (X=Cl, Br, I).

Benefits

1. By adopting the alcoholysis method in the present disclosure, and preparing the metal oxide nanoparticle containing the halogen ligand under a condition without water and oxygen, an effect of the water and the oxygen to a component feature has been avoided; the metal oxide nanoparticle containing the halogen ligand prepared and obtained, wherein the halogen ligand is either a halogen atom or a halogen ion, wherein the halogen ion ionically bonds to an metal ion in the metal oxide nanoparticle, that is, an anion vacancy, and the halogen atom is covalently bonded to a metal atom by overlapping an electron cloud, that may reduce a surface defect of the metal oxide nanoparticle. The metal oxide nanoparticle film containing the halogen ligand prepared from the metal oxide nanoparticle containing the halogen ligand may be applied as the material of the electron transporting layer. The halogen ligand in the film may combine with the halogen atom in the perovskite material before forming the halogen bond, that will effectively reduce the defects existing between the electron transporting layer and the active functional layer (the quantum dot light-emitting layer or absorbing layer) in the electrical component, since a charge dipole generated by the halogen bond may accelerate an electron transportation in an interface between two substances, thus improve a performance of the charge.

2. Performing a passivation process to the metal oxide nanoparticle film containing the halogen ligand by a halogen molecular, may further fill the anion vacancy on the surface of the metal oxide nanoparticle, so as to further reduce the defects on the surface of the metal oxide nanoparticle, and make a surface of the film rich in halogen. The halogen rich on the surface may further increase an amount of the halogen bonds formed with the halogen atoms in the perovskite material. A bonding mechanism between the metal oxide nanoparticle film containing the halogen ligand with the surface passivated by a halogen and the inorganic non-perovskite quantum dot material is that, excessive halogen on the surface of the film first performs a surface passivation by the halogen, which brings halogen onto the surface, further, a non-perovskite quantum dot containing the halogen ligand performs a covalent combination before forming the halogen bonds with the metal oxide nanoparticle film passivated by the halogen according to a form of the halogen bonds, that accelerates the electrons transportation in an interface between two substances and improves the performance of the charge.

DETAILED DESCRIPTION OF EMBODIMENTS

The present disclosure provides a preparation method for a metal oxide nanoparticle film and an electrical component thereof, in order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the present disclosure.

Figure 1:
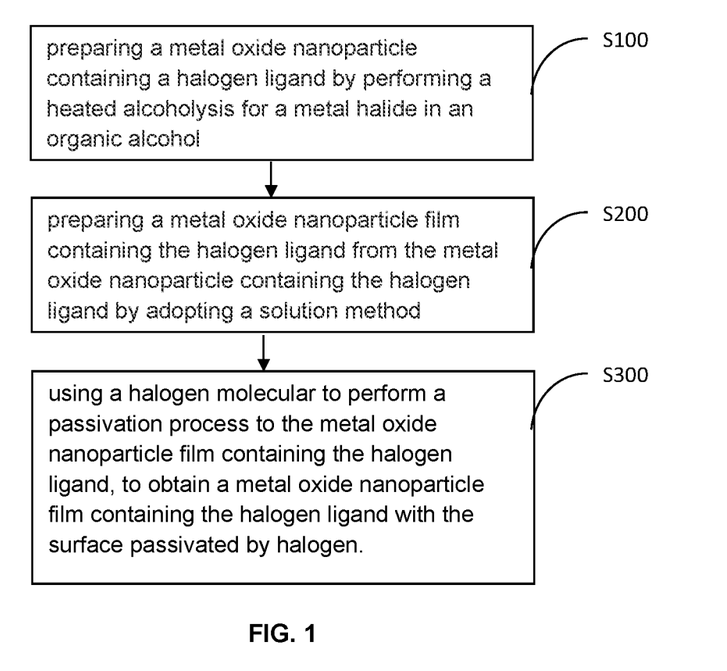
FIG. 1 illustrates a flowchart of an embodiment on a preparation method for the metal oxide nanoparticle film as provided in the present disclosure.

FIG. 1 illustrates a flowchart of an embodiment on a preparation method for the metal oxide nanoparticle film as provided in the present disclosure, shown as FIG. 1, it comprises:

Step S100, preparing a metal oxide nanoparticle containing a halogen ligand by performing a heated alcoholysis for a metal halide in an organic alcohol.

The step S100 comprises specifically: mixing the metal halide and the organic alcohol, wherein a molar to volume ratio range of the metal halide to the organic alcohol is (1-3 mmol): (5-20 ml), and in an embodiment a concentration of the metal halide is 0.1-0.5 mmol/ml, before heating, and finally performing a centrifugal separation treatment to a post-reaction system by the first organic solvent and the second organic solvent, and the metal oxide nanoparticle containing the halogen ligand is then obtained.

The metal oxide nanoparticle containing the halogen ligand is a metal oxide nanoparticle containing the halogen ligand on a surface.

In an embodiment, the metal halide is one of titanium tetrachloride ($TiCl_4$), titanium tetrabromide ($TiBr_4$), titanium tetraiodide ($TiI_4$), zinc chloride ($ZnCl_2$), zinc bromide ($ZnBr_2$), and zinc iodide ($ZnI_2$), in an embodiment, the organic alcohol in the alcoholysis is a phenyl alcohol, including at least one of: benzyl alcohol, phenylethyl alcohol, phenylbutanol, 2,4-benzenediethanol, 1,4-benzenediethanol, 3,4-benzenediethanol, 2,4-benzenedimethanol, 1,4-benzenedimethanol, 3,4-benzenedimethanol, 2,4-benzene dibutanol, 1,4-benzene dibutanol, and 3,4-benzene dibutanol;

in an embodiment, the first organic solvent and the second organic solvent have a different polarity, the first organic solvent is at least one of ethanol, methanol, and acetone, the second organic solvent is at least one of ethyl acetate, methyl acetate, and ethyl formate.

In an embodiment, the metal oxide nanoparticle is one of titanium dioxide ($TiO_2$), zinc oxide (ZnO), tin dioxide ($SnO_2$), and zinc stannate ($Zn_2SnO_4$).

In an embodiment, a size of the metal oxide nanoparticle is between 1 and 15 nm.

A molar ratio of the halogen ligand to a metal element on an outer surface of the metal oxide nanoparticle is from 10% to 15%. The halogen ligand may be a halogen atom or a halogen ion; the halogen atom may be one of fluorine (F), chlorine (Cl), bromine (Br), and iodine (I), and the halogen ion may be one of fluoride ion ($F^-$), chloride ion ($Cl^-$), bromide ion ($Br^-$), and iodide ion ($I^-$). The halogen ligand is mainly ionically bonded to an metal ion in the metal oxide nanoparticle, (that is, an anion vacancy), while part of the halogen ligand is covalently bonded to a metal atom, a covalent bond relies mainly on an overlapping of an electron cloud.

In an embodiment, in the step S100, a temperature for heated alcoholysis is 40-150° C., that is because an excessive temperature may cause, on one hand, a alcoholysis rate too fast, resulting in a non-uniformity of a size of the metal oxide nanoparticle; on another hand, an effect of the halogen passivation may be weakened, mainly because a covalently bonded halogen is detached off at a high temperature.

In an embodiment, the step S100, wherein a time for the heated alcoholysis is 1-4 h, that is because if the time is too short, the metal halide will not be completely decomposed, and during a later purification for the metal oxide nanoparticle by a centrifugation separation, a undecomposed metal halide will precipitate together; and if the time is too long, part of the halogen atoms covalently combining on the surface of the metal oxide nanoparticle may be easy to fall off.

In an embodiment, a concentration of the metal halide is 0.1-0.5 mmol/ml, that is because an overconcentration may cause a speed of the alcoholysis too fast, it is easy to produce a phenomenon that a size of the metal oxide nanoparticle is not uniform; a too low concentration may appear a plurality of phenomena including the speed of the alcoholysis too slow, an amount of the metal oxide nanoparticle obtained relatively less or the metal oxide nanoparticle containing the halide ligand not making an alcoholysis.

Step S200, preparing a metal oxide nanoparticle film containing the halogen ligand from the metal oxide nanoparticle containing the halogen ligand by adopting the solution method.

The step S200 comprises specifically:

dispersing the metal oxide nanoparticle containing the halogen ligand in a mixed polar solvent and non-polar solvent, and obtaining a halogen-containing ligand-containing metal oxide nanoparticle solution;

preparing the metal oxide nanoparticle film containing the halogen ligand from a solution of the metal oxide nanoparticle containing the halogen ligand by adopting the solution method.

In an embodiment, the polar solvent is at least one of ethanol, methanol, and aceton, the non-polar solvent is at least one of chloroform, n-hexane, chlorobenzene, toluene, and octane.

The metal oxide nanoparticle film containing the halogen ligand in the present disclosure is mainly applied as an electron transporting layer in an electrical component, which is applied to transporting a charge. The present disclosure obtains the metal oxide nanoparticle containing the halogen ligand passivation (the metal oxide nanoparticle containing the halogen ligand) through a method of metal halide alcoholysis, then producing the metal oxide nanoparticle containing the halogen ligand passivation (the metal oxide nanoparticle containing the halogen ligand) into a film. A metal oxide nanoparticle film passivated by the halogen ligand may not only reduce the defects on the surface of the metal oxide nanoparticle, but also improve a charge transportation between the metal oxide nanoparticle film and an active functional layer. Additionally, through controlling a time, concentration and a plurality of related parameters of the alcoholysis, it is able to change a ratio of the halide ligand in the metal oxide nanoparticle.

In an embodiment, the present disclosure, after the step S200, further comprises:

Step S300, using a halogen molecular to perform a passivation process to the metal oxide nanoparticle film;

Wherein, the passivation process in the step S300 comprises a step of: immersing the metal oxide nanoparticle film containing the halogen ligand in a solution of carbon tetrachloride (for a dispersion), and taking out after a process of immersion, followed by a dry process, such as being dried by a spin coater.

In an embodiment, the carbon tetrachloride solution containing the halogen molecule, wherein a concentration of the halogen molecule is 0.1-1 mmol/ml, because an overconcentration may cause an over-passivation, making an anion on the surface of the metal oxide nanoparticle get replaced by the halogen, thus causing a change to a forbidden band width of the metal oxide nanoparticle; or if the concentration is too low, a good passivation effect will not be achieved.

In an embodiment, a time for the passivation process is 10-30 min, that is because if a time is too short, the halogens will not be able to combine with the metal ions thoroughly; if a time is too long, an over saturation and passivation may appear, that will also cause that the anion on the surface of the metal oxide nanoparticle get replaced by the halogen.

In an embodiment, the halogen molecule is a halogen elementary substance or an interhalogen compound; the halogen elementary substance is one of $F_2$, $Cl_2$, $Br_2$, $I_2$, the interhalogen compound is one of ICl, IBr, $ICl_3$.

The halogen molecule in the present disclosure is mainly applied to passivating the metal oxide nanoparticle containing the halogen ligand after forming the film, in order to further fill in the anion vacancies on the surface of the metal oxide nanoparticle, so as to improve a surface passivation of the metal oxide nanoparticle, while also preparing to form a halogen bond with other functional layers containing halogen ligand, such as: —X•••Y— (X=Cl, Br, I; Y=Cl, Br, I).

The present disclosure uses the halogen molecule to passivating the metal oxide nanoparticle film containing the halogen ligand, which has not only further reduced a plurality of defects on the surface of the metal oxide nanoparticle, but also been able to further improve the charge transportation between the metal oxide nanoparticle film and the active functional layer.

An embodiment of the metal oxide nanoparticle film of the present disclosure, wherein the film is prepared by adopting the preparation method of the metal oxide nanoparticle film described in the present disclosure.

An electrical component, the electrical component comprises an electron transporting layer, a material of the electron transporting layer is the metal oxide nanoparticle film containing the halogen ligand prepared according to the method disclosed in the present disclosure, or a material of the electron transporting layer is the metal oxide nanoparticle film containing the halogen ligand with a surface passivated by the halogen prepared according to the method disclosed in the present disclosure.

Specifically, the electrical component is a QLED component, the QLED component comprises a cathode, a hole transporting layer, a quantum dot light-emitting layer, an electron transporting layer and an anode. A material of the quantum dot light-emitting layer is a perovskite quantum dot light-emitting material. Further, the perovskite quantum dot light-emitting material is an inorganic perovskite quantum dot light-emitting material or an organic perovskite quantum dot light-emitting material, for example, the inorganic perovskite quantum dot light-emitting material comprises a $CsPbCl_3$ quantum dot light-emitting material, a $CsPbBr_3$ quantum dot light-emitting material, a $CsPbI_3$ quantum dot light-emitting material, the organic perovskite quantum dot light-emitting material comprises a quantum dot light-emitting material of $CH_3NH_3PbX$ (X=Cl, Br, I).

When the quantum dot light-emitting layer adopts an inorganic non-perovskite quantum dot light-emitting material, for example, the inorganic non-perovskite quantum dot light-emitting material may be: a binary phase quantum dot, including, but not limited to: CdS, CdSe, CdTe, InP, AgS, PbS, PbSe, HgS and more quantum dot light-emitting materials; a ternary phase quantum dot, including, but not limited to: $ZnxCd_{1-x}S$, $CuxIn_{1-x}S$, $ZnxCd_{1-x}Se$, $ZnxSe_{1-x}S$, $ZnxCd_{1-x}Te$, $PbSexS_{1-x}$ and more light-emitting materials; a quaternary phase quantum dot, including, but not limited to: $ZnxCd_{1-x}S/ZnSe$, $CuxIn_{1-x}S/ZnS$, $ZnxCd_{1-x}Se/ZnS$, CuInSeS, $ZnxCd_{1-x}Te/ZnS$, $PbSexS_{1-x}/ZnS$ and more light-emitting materials; a material of the electron transport layer is a metal oxide nanoparticle film containing the halogen ligand with the surface passivated by the halogen.

Specifically, the electrical component is a perovskite battery component, the perovskite battery component comprises a cathode, a hole transporting layer, a quantum dot light-absorbing layer, an electron transporting layer and an anode. Wherein the quantum dot light-absorbing layer is a perovskite quantum dot light-absorbing layer and the electron transporting layer is adjacent to the perovskite quantum dot light-absorbing layer. A material of the quantum dot light-absorbing layer is an inorganic perovskite quantum dot material or an organic perovskite quantum dot material, for example, the inorganic perovskite quantum dot material comprises $CsPbCl_3$, $CsPbBr_3$, and $CsPbI_3$, the organic perovskite quantum dot material comprises $CH_3NH_3PbX$ (X=Cl, Br, I).

Figure 2:
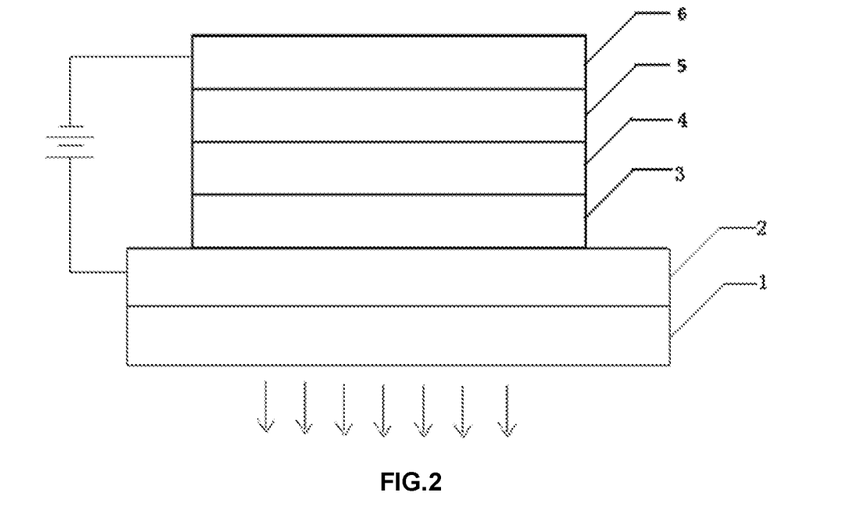
FIG. 2 illustrates a schematic diagram on a QLED component in the present disclosure.

Specifically, the electrical component is a QLED component, shown as FIG. 2, the QLED component comprises a cathode 2 (the cathode 2 is placed on a base board 1), a hole transporting layer 3, a quantum dot light-emitting layer 4, an electron transporting layer 5 and an anode 6. Wherein the electron transporting layer 5 is adjacent to the quantum dot light-emitting layer 4, an interface between the electron transporting layer 5 and the quantum dot light-emitting layer 4 has a halogen bond connection. A material of the electron transporting layer 5 is the metal oxide nanoparticle film containing the halogen ligand prepared according to the method disclosed in the present disclosure, or the metal oxide nanoparticle film containing the halogen ligand with the surface passivated by the halogen prepared according to the method disclosed in the present disclosure. A material of the quantum dot light-emitting layer is a perovskite quantum dot light-emitting material. Further, the perovskite quantum dot light-emitting material is an inorganic perovskite quantum dot light-emitting material or an organic perovskite quantum dot light-emitting material, for example, the inorganic perovskite quantum dot light-emitting material comprises a $CsPbCl_3$ quantum dot light-emitting material, a $CsPbBr_3$ quantum dot light-emitting material, a $CsPbI_3$ quantum dot light-emitting material, the organic perovskite quantum dot light-emitting material comprises a quantum dot light-emitting material of $CH_3NH_3PbX$ (X=Cl, Br, I). When the quantum dot light-emitting layer adopts an inorganic non-perovskite quantum dot light-emitting material, for example, the inorganic non-perovskite quantum dot light-emitting material may be: a binary phase quantum dot, including, but not limited to: CdS, CdSe, CdTe, InP, AgS, PbS, PbSe, HgS and more quantum dot light-emitting materials; a ternary phase quantum dot, including, but not limited to: $ZnxCd_{1-x}S$, $CuxIn_{1-x}S$, $ZnxCd_{1-x}Se$, $ZnxSe_{1-x}S$, $ZnxCd_{1-x}Te$, $PbSexS_{1-x}$ and more light-emitting materials; a quaternary phase quantum dot, including, but not limited to: $ZnxCd_{1-x}S/ZnSe$, $CuxIn_{1-x}S/ZnS$, $ZnxCd_{1-x}Se/ZnS$, CuInSeS, $ZnxCd_{1-x}Te/ZnS$, $PbSexS_{1-x}/ZnS$ and more light-emitting materials; a material of the electron transport layer is a metal oxide nanoparticle film containing the halogen ligand with the surface passivated by the halogen.

Figure 3:
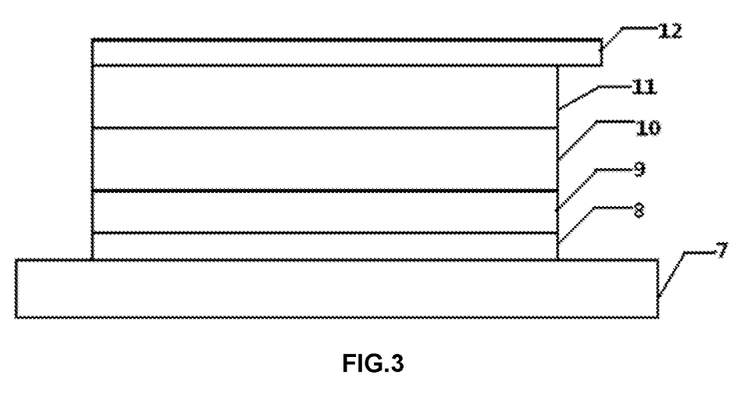
FIG. 3 illustrates a schematic diagram on a perovskite battery component in the present disclosure.

Specifically, the electrical component is a perovskite battery component, shown as FIG. 3, the perovskite battery component comprises a cathode 12, a hole transporting layer 11, a quantum dot light-absorbing layer 10, an electron transporting layer 9 and an anode 8 (the anode 8 is placed on a base board 7). Wherein the electron transporting layer 9 is adjacent to the perovskite quantum dot light-absorbing layer 10, an interface between the electron transporting layer 9 and the perovskite quantum dot light-absorbing layer 10 has a halogen bond connection. A material of the electron transporting layer 9 is the metal oxide nanoparticle film containing the halogen ligand prepared according to the method disclosed in the present disclosure, or the metal oxide nanoparticle film containing the halogen ligand with the surface passivated by the halogen prepared according to the method disclosed in the present disclosure. Further, a material of the quantum dot light-absorbing layer is an inorganic perovskite quantum dot material or an organic perovskite quantum dot material, for example, the inorganic perovskite quantum dot material comprises $CsPbCl_3$, $CsPbBr_3$, and $CsPbI_3$, the organic perovskite quantum dot material comprises $CH_3NH_3PbX$ (X=Cl, Br, I).

Comparing to what is in the prior arts, the present disclosure has a plurality of following advantages:

1. By adopting the alcoholysis method in the present disclosure, and preparing the metal oxide nanoparticle containing the halogen ligand under a condition without water and oxygen, an effect of the water and the oxygen to a component feature has been avoided; the metal oxide nanoparticle containing the halogen ligand prepared and obtained, wherein the halogen ligand is either a halogen atom or a halogen ion, wherein the halogen ion ionically bonds to an metal ion in the metal oxide nanoparticle, that is, an anion vacancy, and the halogen atom is covalently bonded to a metal atom by overlapping an electron cloud, that may reduce a surface defect of the metal oxide nanoparticle. The metal oxide nanoparticle film containing the halogen ligand prepared from the metal oxide nanoparticle containing the halogen ligand may be applied as the material of the electron transporting layer. The halogen ligand in the film may combine with the halogen atom in the perovskite material before forming the halogen bond, that will effectively reduce the defects existing between the electron transporting layer and the active functional layer (the quantum dot light-emitting layer or absorbing layer) in the electrical component, since a charge dipole generated by the halogen bond may accelerate an electron transportation in an interface between two substances, thus improve a performance of the charge.

2. Adopting a halogen molecular to perform a passivation process to the metal oxide nanoparticle film containing the halogen ligand, may further fill the anion vacancy on the surface of the metal oxide nanoparticle, so as to further reduce the defects on the surface of the metal oxide nanoparticle, and make a surface of the film rich in halogen. The halogen rich on the surface may further increase an amount of the halogen bonds formed with the halogen atoms in the perovskite material. A bonding mechanism between the metal oxide nanoparticle film with the surface passivated by a halogen and the inorganic non-perovskite quantum dot material is that, excessive halogen on the surface of the film first performs a surface passivation by the halogen, which brings halogen onto the surface, further, a non-perovskite quantum dot containing the halogen ligand performs a covalent combination before forming the halogen bonds with the metal oxide nanoparticle film passivated by the halogen according to a form of the halogen bonds, that accelerates the electrons transportation in an interface between two substances and improves the performance of the charge.

A plurality of embodiments is listed below to describe the present disclosure specifically.

Embodiment 1

An application of using titanium tetrachloride ($TiCl_4$), benzyl alcohol to prepare a titanium dioxide ($TiO_2$) nanoparticle passivated by the chlorine atom and a battery is taken as an example for a description in details.

A preparation method of the titanium dioxide ($TiO_2$) nanoparticle film containing a chlorine ligand with the surface passivated by the chlorine atom in the present embodiment, comprises the following steps:

1). Preparing the $TiO_2$ Nanoparticle:

Take 2 mol of $TiCl_4$ and 10 ml of benzyl alcohol and place in a 25 ml three-necked flask, heat at 85° C. for 3 h under an atmospheric condition, to obtain $TiO_2$ with a particle size of about 5 nm in a non-hydrolysis process; using ethanol and ethyl acetate to separate the $TiO_2$ nanoparticle by a centrifugation, then disperse the $TiO_2$ nanoparticle in a mixed methanol and chloroform solution, and an outer surface of the $TiO_2$ nanoparticle obtained is covered by the Cl atoms, now a ratio of the Cl atoms to the Ti atoms on the outer surface of the $TiO_2$ nanoparticle is about 10%.

2). Using the $Cl_2$ Molecular to Further Passivate a Titanium Dioxide ($TiO_2$) Nanoparticle Film Containing a Chlorine Ligand:

Take 100 mg of $TiO_2$ nanoparticle containing the Cl atom and dissolve in 5 ml of a methanol and chloroform solution, then extract 100 µl of the solution with a pipette, spin-coat at 2000 rpm and 30 s, to prepare a solid membrane of the $TiO_2$ nanoparticle containing the Cl atom before a dry process; immerse the solid membrane after drying out into a 20 ml carbon tetrachloride ($CCl_4$) solution containing 0.3 mmol of $Cl_2$ molecule for 20 minutes before taking out, then dry out by idling at 2000 rpm for 30 s, a $TiO_2$ nanoparticle film containing the chlorine ligand with the surface passivated by chlorine is then obtained.

Combining with FIG. 3, the perovskite battery component comprises a cathode 12, a hole transporting layer 11, a perovskite quantum dot light-absorbing layer 10, an electron transporting layer 9 and an anode 8 (the anode 8 is placed on a base board 7). The electron transporting layer 9 adopts the $TiO_2$ nanoparticle film containing the chlorine ligand with the surface passivated by chlorine as described in the present embodiment, and the adjacent perovskite quantum dot light-absorbing layer 10 adopts a $CH_3NH_3PbCl$ material.

The Cl in the $TiO_2$ nanoparticle film containing the chlorine ligand with the surface passivated by chlorine and the Cl in the perovskite $CH_3NH_3PbCl$ form the chlorine bond —X•••Y— (X=Cl; Y=Cl). Since the halogen bond has a charge dipole effect, thus it may accelerate an electron transportation in the interface between two substances, thus improve the performance of the charge.

Embodiment 2

An application of using titanium tetrabromide ($TiBr_4$), benzyl alcohol to prepare a titanium dioxide ($TiO_2$) nanoparticle passivated by the bromide atom and a battery is taken as an example for a description in details.

1). Preparing the $TiO_2$ Nanoparticle:

Take 2 mol of $TiBr_4$ and 10 ml of benzyl alcohol and place in a 25 ml three-necked flask, heat at 85° C. for 3 h under an atmospheric condition, to obtain $TiO_2$ with a particle size of about 5 nm in a non-hydrolysis process; using ethanol and ethyl acetate to separate the $TiO_2$ nanoparticle by a centrifugation, then disperse the $TiO_2$ nanoparticle in a mixed methanol and chloroform solution, and an outer surface of the $TiO_2$ nanoparticle obtained is covered by the Br atoms, now a ratio of the Br atoms to the Ti atoms on the outer surface of the $TiO_2$ nanoparticle is about 12%.

2) Using the Bromide Molecular ($Br_2$) to Further Passivate a Titanium Dioxide (TiO2) Nanoparticle Film Containing a Bromine Ligand:

Take 100 mg of $TiO_2$ nanoparticle containing the Br atom and dissolve in 5 ml of a methanol and chloroform solution, then extract 100 µl of the solution with a pipette, spin-coat at 2000 rpm and 30 s, to prepare a solid membrane of the $TiO_2$ nanoparticle containing the Br atom before a dry process; immerse the solid membrane after drying out into a 20 ml carbon tetrachloride ($CCl_4$) solution containing 0.3 mmol of $Br_2$ molecule for 20 minutes before taking out, then dry out by idling at 2000 rpm for 30 s, a $TiO_2$ nanoparticle film containing a bromine ligand with the surface passivated by bromine is then obtained.

Combining with FIG. 2, the QLED component in the present embodiment comprises a cathode 2 (the cathode 2 is placed on a base board 1), a hole transporting layer 3, a quantum dot light-emitting layer 4, an electron transporting layer 5 and an anode 6. Wherein the electron transporting layer 5 adopts the $TiO_2$ nanoparticle film containing the bromine ligand with the surface passivated by bromine as described in the present embodiment, and the adjacent quantum dot light-emitting layer 4 adopts a PbS quantum dot film material.

Excessive halogen in the $TiO_2$ nanoparticle film containing the bromine ligand with the surface passivated by bromine first performs a halogen surface passivation to the PbS quantum dots on the interface, to make the surface have halogens, next, the PbS quantum dot having the halogen ligand combines covalently with the $TiO_2$ nanoparticle film passivated by the halogen in a form of the halogen bond before forming the halogen bond: —X•••Y— (X=Br; Y=Br). Since the halogen bond has a charge dipole effect, thus it may accelerate an electron transportation in the interface between two substances, thus improve the performance of the charge.

Embodiment 3

An application of using titanium tetrachloride ($TiCl_4$), benzyl alcohol to prepare a QLED component is taken as an example for a description in details.

1). Preparing the $TiO_2$ Nanoparticle Film Containing the Chlorine Ligand:

Take 2 mol of $TiCl_4$ and 10 ml of benzyl alcohol and place in a 25 ml three-necked flask, heat at 85° C. for 3 h under an atmospheric condition, to obtain $TiO_2$ with a particle size of about 5 nm in a non-hydrolysis process; using ethanol and ethyl acetate to separate the $TiO_2$ nanoparticle by a centrifugation, then disperse the $TiO_2$ nanoparticle in a mixed methanol and chloroform solution, and an outer surface of the $TiO_2$ nanoparticle obtained is covered by the Cl atoms, now a ratio of the Cl atoms to the Ti atoms on the outer surface of the $TiO_2$ nanoparticle is about 12%.

Combining with FIG. 2, the QLED component in the present embodiment comprises a cathode 2 (the cathode 2 is placed on a base board 1), a hole transporting layer 3, a quantum dot light-emitting layer 4, an electron transporting layer 5 and an anode 6. Wherein the electron transporting layer 5 adopts the $TiO_2$ nanoparticle film containing the chlorine ligand as described in the present embodiment, and the adjacent quantum dot light-emitting layer 4 adopts a $CsPbCl_3$ quantum dot material.

The Cl in the $TiO_2$ nanoparticle film containing the chlorine ligand with the surface passivated by chlorine and the Cl in the perovskite $CsPbCl_3$ form the chlorine bond —X•••Y— (X=Cl; Y=Cl). Since the halogen bond has a charge dipole effect, thus it may accelerate electron transportation in the interface between two substances, thus improve the performance of the charge.

All above, the present disclosure discloses a preparation method for a metal oxide nanoparticle film and an electrical component thereof. The present disclosure obtains the metal oxide nanoparticle containing the halogen ligand through a method of the metal halogen alcoholysis, through controlling a time, concentration and a plurality of related parameters of the alcoholysis, it is able to change a ratio of the halide in the metal oxide nanoparticle, followed by preparing the metal oxide nanoparticle containing the halogen ligand into a film, then using the halogen to make a passivation process to the film, which has not only further reduced the defects on the surface of the metal oxide nanoparticle, but also improve the charge transportation between the metal oxide nanoparticle film and the active functional layer, and improve a transportation efficiency, thus an efficiency of the component is improved. Additionally, the present disclosure owns a simple operation and an easy repetition.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. A preparation method for a metal oxide nanoparticle film, comprising:
   preparing a metal oxide nanoparticle containing a halogen ligand by performing a heated alcoholysis for a metal halide in an organic alcohol, comprising:
   mixing and heating the metal halide and the organic alcohol, then making a centrifugal separation process to a reaction system by a first organic solvent and a second organic solvent, before obtaining the metal oxide nanoparticle containing the halogen ligand; and
   preparing and obtaining a metal oxide nanoparticle film containing the halogen ligand from the metal oxide nanoparticle containing the halogen ligand by adopting a solution method.

2. The preparation method for the metal oxide nanoparticle film according to claim 1, wherein the metal halide and the organic alcohol are mixed according to a molar to volume ratio of the metal halide to the organic alcohol in a range of (1-3 mmol): (5-20 ml);
   and/or the metal halide is one of $TiCl_4$ (Titanium Tetrachloride), $TiBr_4$ (Titanium Tetrabromide), $TiI_4$ (Titanium Tetraiodide), $ZnCl_2$ (Zinc Chloride), $ZnBr_2$ (Zinc Bromide), and $ZnI_2$ (Zinc Iodide);
   and/or the organic alcohol is a phenyl alcohol;
   and/or the metal oxide nanoparticle is one of $TiO_2$ (Titanium Dioxide), ZnO (Zinc Oxide), $SnO_2$ (Tin Oxide), and $Zn_2SnO_4$ (Zinc Stannate), while a size of the metal oxide nanoparticle is between 1 and 15 nm;
   and/or a molar ratio of the halogen ligand to a metal element on an outer surface of the metal oxide nanoparticle is from 10% to 15%;
   and/or the halogen ligand is a halogen atom or a halogen ion.

3. The preparation method for the metal oxide nanoparticle film according to claim 2, wherein the phenyl alcohol includes at least one of: benzyl alcohol, phenylethyl alcohol, phenylbutanol, 2,4-benzenediethanol, 1,4-benzenediethanol, 3,4-benzenediethanol, 2,4-benzenedimethanol, 1,4-benzenedimethanol, 3,4-benzenedimethanol, 2,4-benzenedibutanol, 1,4-benzenedibutanol, and 3,4-benzenedibutanol.

4. The preparation method for the metal oxide nanoparticle film according to claim 1, wherein the first organic solvent and the second organic solvent have a different polarity, the first organic solvent is at least one of ethanol, methanol, and acetone, and/or the second organic solvent is at least one of ethyl acetate, methyl acetate, and ethyl formate.

5. The preparation method for the metal oxide nanoparticle film according to claim 1, wherein a temperature for the heated alcoholysis is 40-150° C., a time for the heated alcoholysis is 1 to 4 hours.

6. The preparation method for the metal oxide nanoparticle film according to claim 1, wherein a step of preparing the metal oxide nanoparticle film containing the halogen ligand from the metal oxide nanoparticle containing the halogen ligand by adopting the solution method comprising:
   dispersing the metal oxide nanoparticle containing the halogen ligand in a mixed polar solvent and non-polar solvent, and obtaining a metal oxide nanoparticle solution containing the halogen ligand;
   preparing the metal oxide nanoparticle film containing the halogen ligand from the metal oxide nanoparticle solution containing the halogen ligand by adopting the solution method.

7. The preparation method for the metal oxide nanoparticle film according to claim 1, wherein after preparing the metal oxide nanoparticle film containing the halogen ligand from the metal oxide nanoparticle containing the halogen ligand by adopting the solution method, further comprising:
   making a passivation process to the metal oxide nanoparticle film containing the halogen ligand by using a halogen molecule, before obtaining a metal oxide nanoparticle film containing the halogen ligand with a surface passivated by the halogen.

8. The preparation method for the metal oxide nanoparticle film according to claim 7, wherein the halogen molecule is one of a halogen element and an interhalogen compound, the halogen element is one of $F_2$ (Fluorine), $Cl_2$ (Chlorine), $Br_2$ (Bromine), and $I_2$ (Iodine), and the interhalogen compound is one of ICl (Iodine Monochloride), IBr (Iodine Bromide), and $ICl_3$ (Iodine Trichloride).

9. An electrical component, the electrical component comprises an electron transporting layer, wherein a material of the electron transporting layer is a metal oxide nanoparticle film containing the a halogen ligand prepared by a method comprising:
  preparing a metal oxide nanoparticle containing a halogen ligand by performing a heated alcoholysis for a metal halide in an organic alcohol, comprising:
    mixing and heating the metal halide and the organic alcohol, then making a centrifugal separation process to a reaction system by a first organic solvent and a second organic solvent, before obtaining the metal oxide nanoparticle containing the halogen ligand; and
  preparing and obtaining the metal oxide nanoparticle film containing the halogen ligand from the metal oxide nanoparticle containing the halogen ligand by adopting a solution method.

10. The electrical component according to claim 9, wherein the electrical component is a quantum dot light-emitting diode, the electron transporting layer is adjacent to a quantum dot light emitting layer, when a material of the quantum dot light emitting layer is a perovskite quantum dot light-emitting material, a material of the electron transporting layer is the metal oxide nanoparticle film containing the halogen ligand, or the material of the electron transporting layer is the metal oxide nanoparticle film containing the halogen ligand with the surface passivated by the halogen; when the material of the quantum dot light-emitting layer is an inorganic non-perovskite quantum dot light-emitting material, the material of the electron transporting layer is the metal oxide nanoparticle film containing the halogen ligand with the surface passivated by the halogen.

11. The electrical component according to claim 9, wherein the electrical component is a perovskite battery component, the electron transporting layer is adjacent to a perovskite quantum dot light-absorbing layer.

12. The electrical component according to claim 9, wherein the material of the electron transporting layer is the metal oxide nanoparticle film containing the halogen ligand with a surface passivated by a halogen prepared by the method further comprising:
  making a passivation process to the metal oxide nanoparticle film containing the halogen ligand by using a halogen molecule, before obtaining the metal oxide nanoparticle film containing the halogen ligand with a surface passivated by the halogen.

* * * * *